(12) United States Patent
Hung et al.

(10) Patent No.: US 9,379,036 B2
(45) Date of Patent: *Jun. 28, 2016

(54) 3DIC PACKAGES WITH HEAT DISSIPATION STRUCTURES

(71) Applicant: Taiwan Semiconductor Manufacturing Company, Ltd., Hsin-Chu (TW)

(72) Inventors: Wensen Hung, Zhubei (TW); Szu-Po Huang, Taichung (TW); Kim Hong Chen, Fremont, CA (US); Shin-Puu Jeng, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/579,388

(22) Filed: Dec. 22, 2014

(65) Prior Publication Data

US 2015/0108631 A1   Apr. 23, 2015

Related U.S. Application Data

(62) Division of application No. 13/957,727, filed on Aug. 2, 2013, now Pat. No. 9,082,743.

(51) Int. Cl.
*H01L 23/10* (2006.01)
*H01L 23/367* (2006.01)
*H01L 23/34* (2006.01)
(Continued)

(52) U.S. Cl.
CPC ............ *H01L 23/3675* (2013.01); *H01L 23/34* (2013.01); *H01L 23/42* (2013.01); *H01L 25/0652* (2013.01); *H01L 25/0657* (2013.01); *H01L 2224/16225* (2013.01); *H01L 2224/32225* (2013.01); *H01L 2224/73204* (2013.01); *H01L 2224/73253* (2013.01); *H01L 2224/92225* (2013.01); *H01L 2225/06513* (2013.01); *H01L 2225/06517* (2013.01); *H01L 2225/06541* (2013.01); *H01L 2225/06568* (2013.01); *H01L 2225/06589* (2013.01); *H01L 2924/0002* (2013.01); *H01L 2924/15311* (2013.01)

(58) Field of Classification Search
USPC ............. 257/E21.511, E23.08, E23.085, 712, 257/713; 438/108
See application file for complete search history.

(56) References Cited

U.S. PATENT DOCUMENTS 5,548,482 A   8/1996   Hatauchi et al.
5,880,524 A   3/1999   Xie
(Continued)

OTHER PUBLICATIONS

Ajami, Amir H., et al. "Modeling and Analysis of Nonuniform Substrate Temperature Effects on Global ULSI Interconnects," IEEE Transactions on Computer-Aided Design of Integrated Circuits and Systems, vol. 24, No. 6, Jun. 2005, 13 pages.

(Continued)

*Primary Examiner* — Telly Green
(74) *Attorney, Agent, or Firm* — Slater Matsil, LLP

(57) ABSTRACT

A package includes a first die and a second die underlying the first die and in a same first die stack as the first die. The second die includes a first portion overlapped by the first die, and a second portion not overlapped by the first die. A first Thermal Interface Material (TIM) is over and contacting a top surface of the first die. A heat dissipating lid has a first bottom surface contacting the first TIM. A second TIM is over and contacting the second portion of the second die. A heat dissipating ring is over and contacting the second TIM.

20 Claims, 17 Drawing Sheets

(51) Int. Cl.
H01L 25/065 (2006.01)
H01L 23/42 (2006.01)

(56) References Cited

U.S. PATENT DOCUMENTS

| | | | |
|---|---|---|---|
| 7,208,975 B1 | 4/2007 | Agrawal et al. | |
| 7,592,697 B2 | 9/2009 | Arana et al. | |
| 9,082,743 B2* | 7/2015 | Hung | H01L 23/3675 |
| | | | 257/686 |
| 2005/0161192 A1* | 7/2005 | Shigeura | B01L 3/50851 |
| | | | 165/61 |
| 2008/0093733 A1 | 4/2008 | Hsu | |
| 2009/0057881 A1 | 3/2009 | Arana et al. | |
| 2009/0283902 A1 | 11/2009 | Bezama et al. | |
| 2010/0213600 A1* | 8/2010 | Lau | H01L 23/055 |
| | | | 257/693 |
| 2011/0012255 A1 | 1/2011 | Suganuma | |
| 2011/0018125 A1 | 1/2011 | Loo et al. | |
| 2011/0147916 A1 | 6/2011 | Su | |
| 2012/0025397 A1 | 2/2012 | Miller et al. | |
| 2012/0049341 A1 | 3/2012 | Bezama et al. | |
| 2013/0119528 A1 | 5/2013 | Groothuis et al. | |
| 2014/0061893 A1 | 3/2014 | Saeidi et al. | |
| 2014/0217575 A1* | 8/2014 | Hung | H01L 21/50 |
| | | | 257/713 |

OTHER PUBLICATIONS

De Orio, R.L., et al., "Physically based models of electromigration: From Black's equation to modern TCAD models," Elsevier Ltd., Microelectronics Reliability, 50, Mar. 2010, pp. 775-789.

* cited by examiner

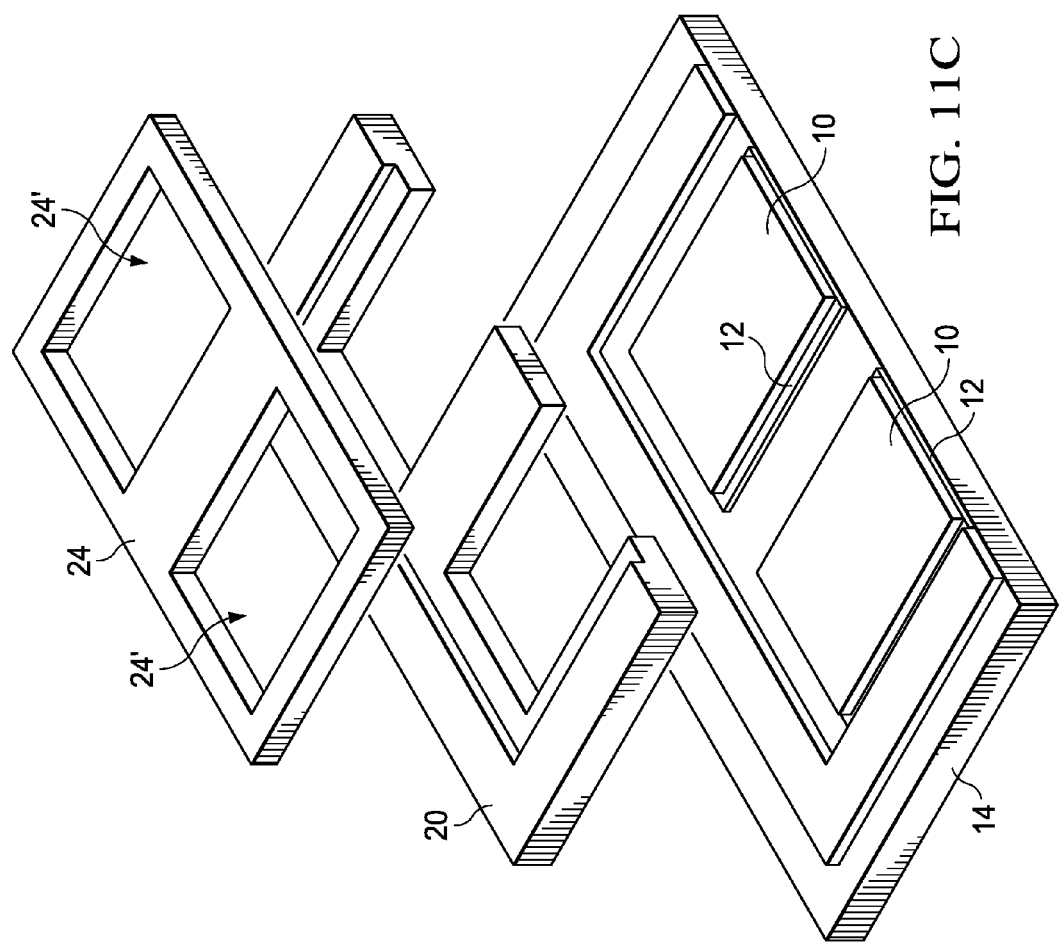

3DIC PACKAGES WITH HEAT DISSIPATION STRUCTURES

PRIORITY CLAIM AND CROSS-REFERENCE

This application is a divisional of U.S. patent application Ser. No. 13/957,727, entitled "3DIC Packages with Heat Dissipation Structures," filed on Aug. 2, 2013, which application is incorporated herein by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). The heat dissipation is a challenge in the 3DICs. There exists a bottleneck in efficiently dissipating the heat generated in the inner dies of the 3DICs. The heat generated in the inner dies has to be dissipated to outer components such as outer dies before the heat can be conducted to any heat spreader. Between the stacked dies, however, there exist other materials such as underfill, molding compound, etc, which are not effective in conducting heat. Furthermore, the stacked dies may also be molded in a molding compound, which prevents the efficient heat dissipation.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 11A, 11B, and 11C illustrate the cross-sectional view, the perspective view, and a cross-section of the perspective view of a package in accordance with some embodiments;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A package with improved heat dissipating ability and the method of forming the same are provided in accordance with various exemplary embodiments. The intermediate stages of forming the package are illustrated. The variations of the embodiments are discussed. Throughout the various views and illustrative embodiments, like reference numbers are used to designate like elements.

Figure 1:
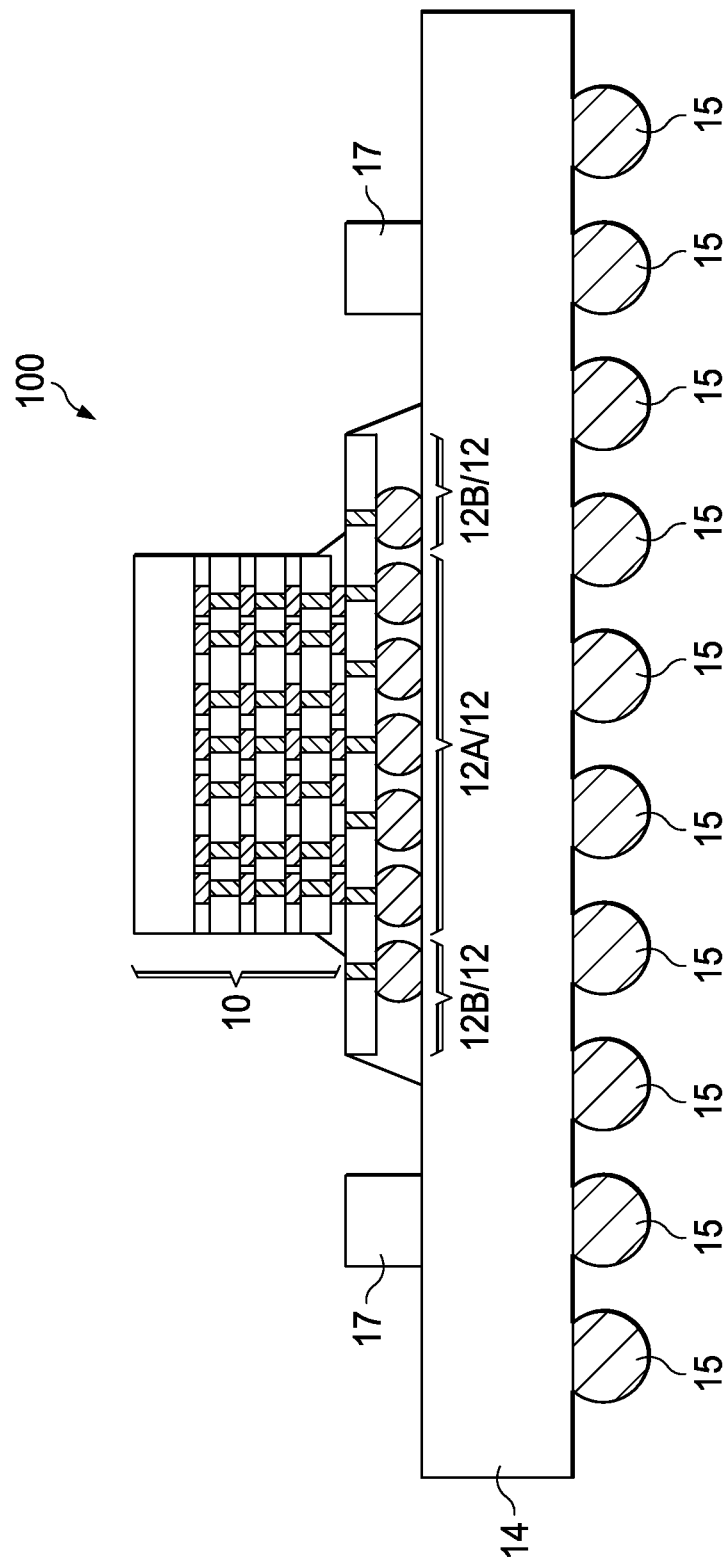
FIGS. 1 through 5 are cross-sectional views of intermediate stages in the formation of a package in accordance with some exemplary embodiments.

FIG. 1 illustrates the cross-sectional view of an initial stage in the formation of Three-Dimensional Integrated Circuit (3DIC) package 100, which includes dies 10 stacked on die 12. In some embodiments, dies 10 are memory dies that form a memory stack. In alternative embodiments, dies 10 are logic dies. In yet alternative embodiments, dies 10 include both logic dies and memory dies. Die 12 may be a logic die, which may further be a Central Processing Unit (CPU), a Graphics Processing Unit (GPU), or the like. Dies 10 and 12 may be bonded through flip chip bonding, wherein metal bumps, solder balls, or the like are used to bond dies 10 and 12.

Die 12 has a top view size greater than the top view size of dies 10. As shown in FIG. 1, die 12 may extend laterally beyond dies 10, and may include portion 12A that is overlapped by dies 10, and portions 12B that are not overlapped by dies 10. The die stack including dies 10 and 12 are further bonded to package component 14, which may be a package substrate, an interposer, a Printed Circuit Board (PCB), or the like. Discrete passive devices 17 such as resistors, capacitors, transformers, and the like, may also be bonded to package component 14. Solder balls 15 are attached to package component 14, wherein dies 10/12 and solder balls 15 are on opposite sides of package component 14.

Figure 2:
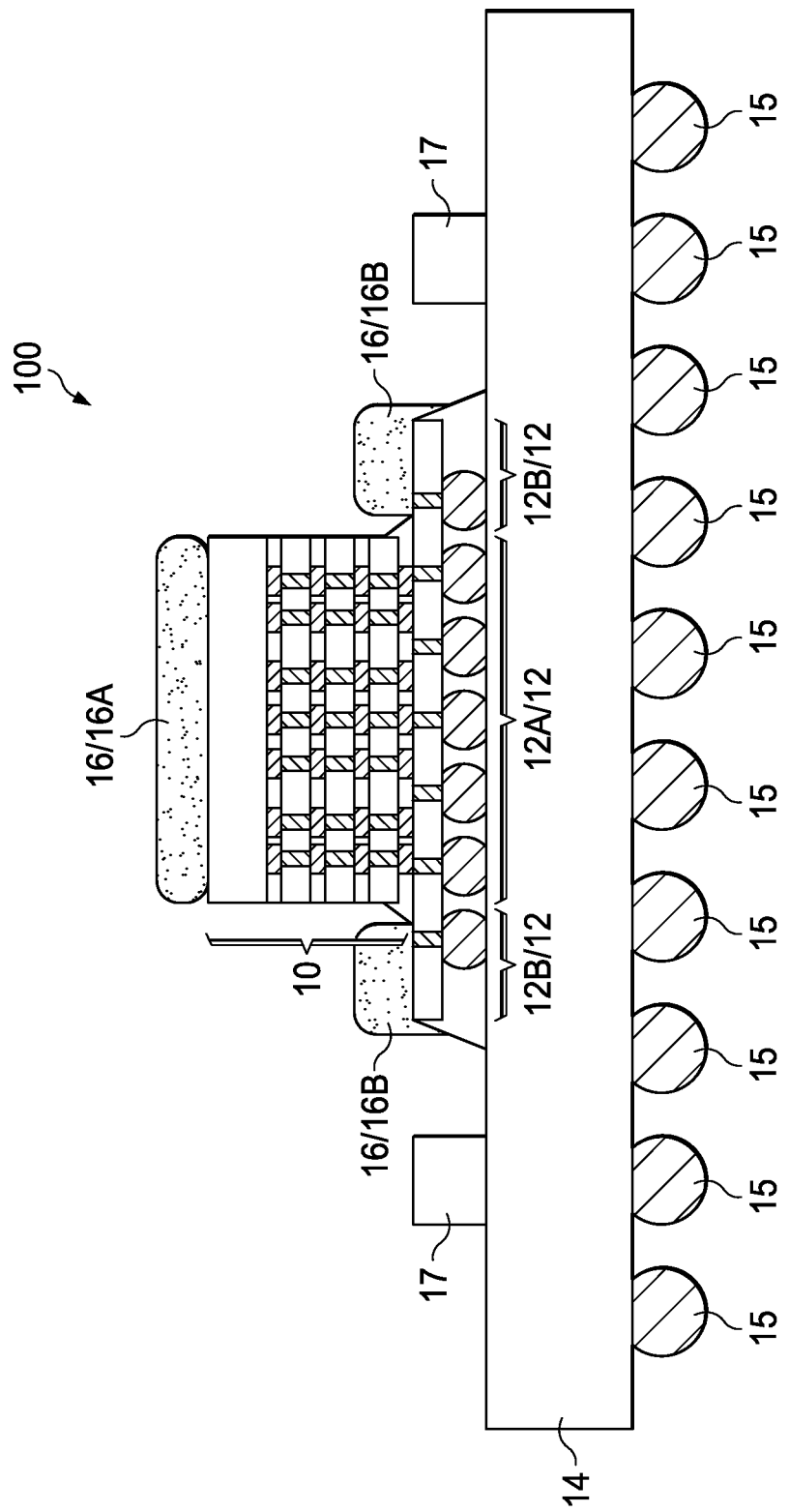
Figure 7:
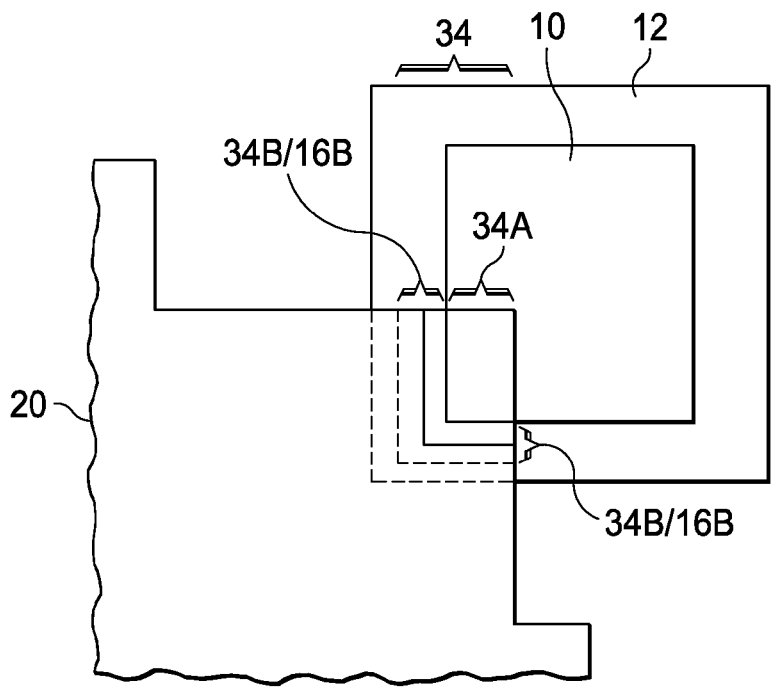
FIGS. 7, 8, and 9 illustrate some exemplary allocation schemes of high-power-consuming circuits and the respective heat dissipating rings.
Figure 8:
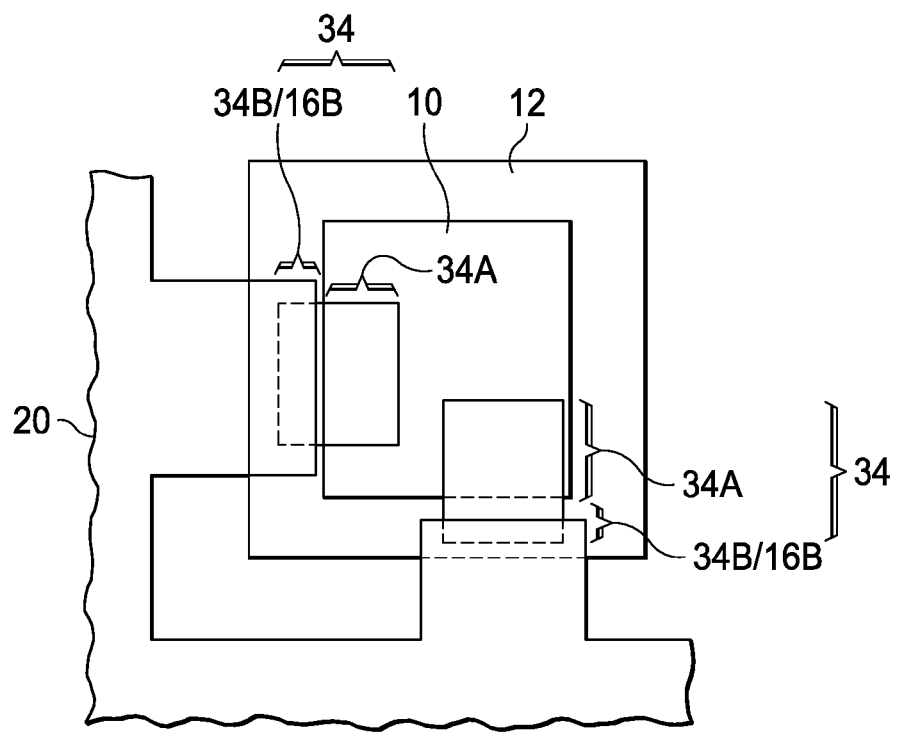
Figure 9:
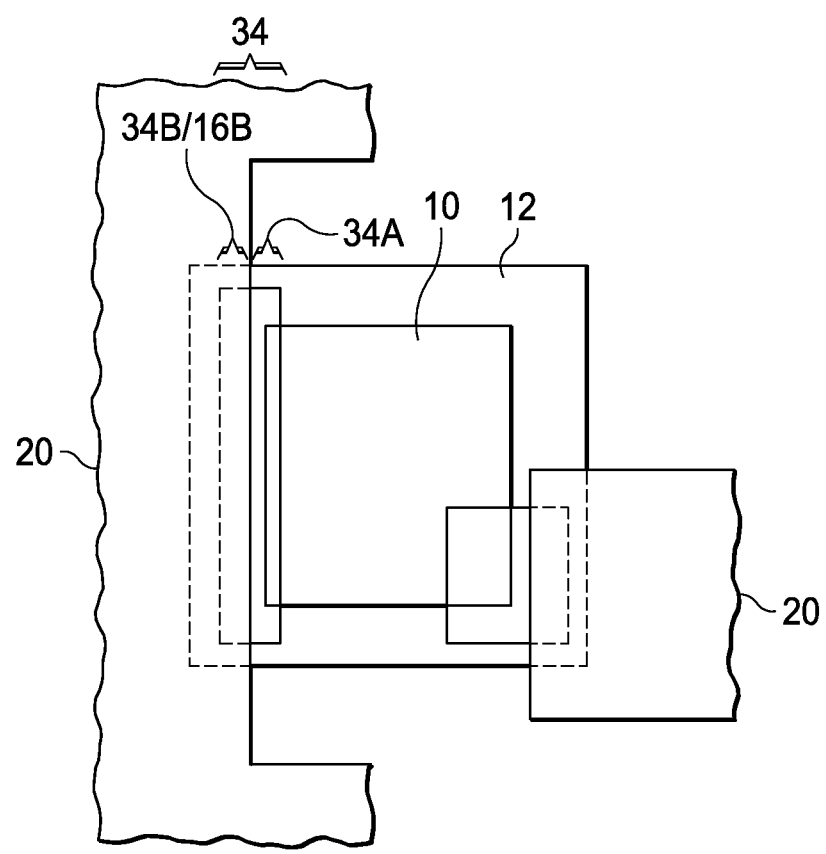

Next, referring to FIG. 2, Thermal Interface Material (TIM) 16 is dispensed on dies 10 and 12. TIM 16 includes portion 16A, which is dispensed on the top of dies 10. Furthermore, TIM 16 includes portions 16B, which are also dispensed on, and may be in physical contact with, the top surfaces of portions 12B of die 12. TIM 16 has a good thermal conductivity, which may be greater than about 2 W/m*K, and may be as equal to, or higher than, about 10 W/m*K or 50 W/m*K. TIM portions 16B may, or may not, form a ring. In accordance with some embodiments, when forming the ring, TIM portions 16B encircle dies 10. In which embodiments, portions 12B of die 12 also forms a ring. FIGS. 7, 8, and 9 illustrate the embodiments wherein TIM portion 16B does not form a ring.

Figure 3:
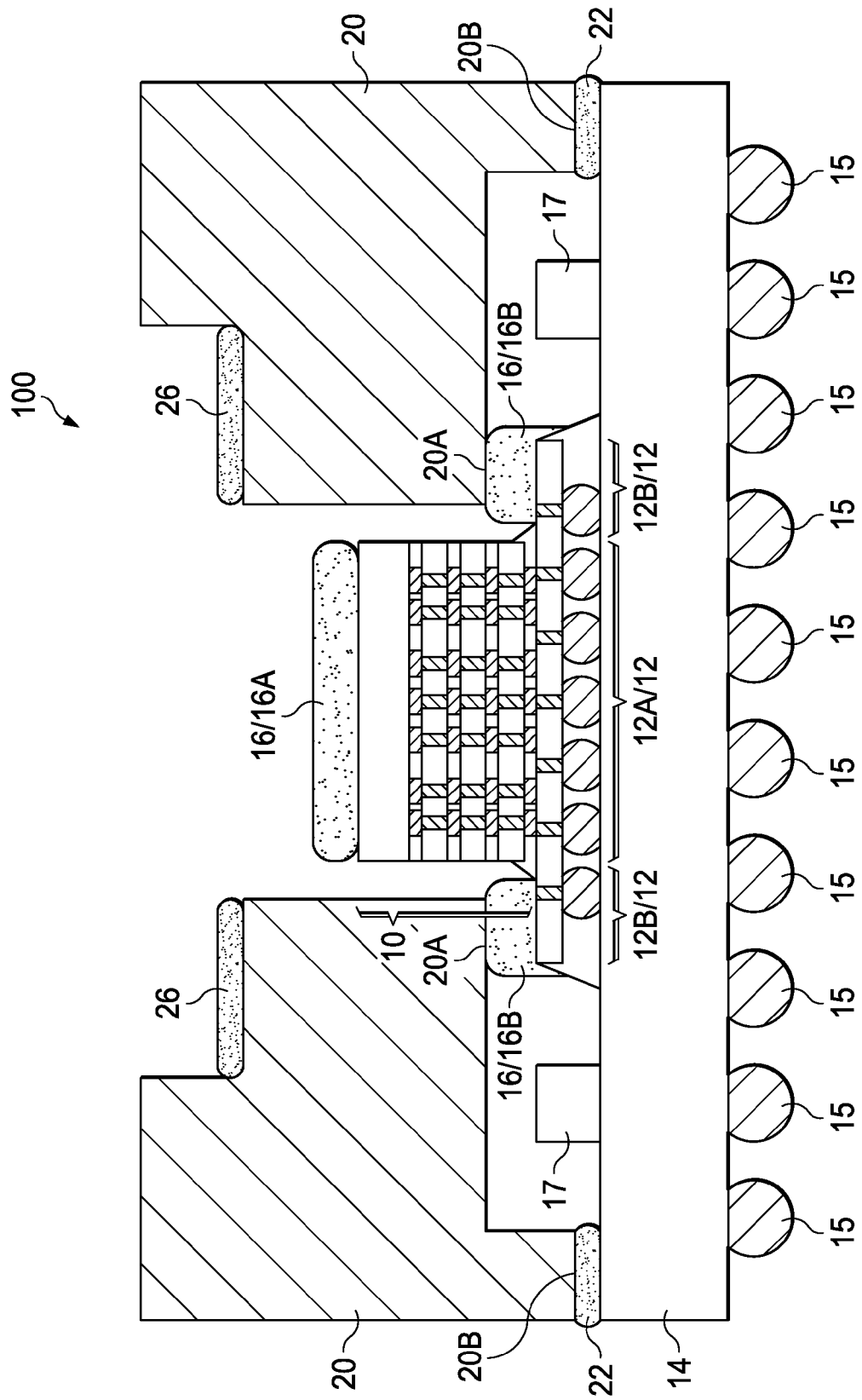

FIG. 3 illustrates the attachment of heat dissipation ring 20 to package component 14. Heat dissipation ring 20 has a high thermal conductivity greater than about 100 W/m*K, for example, and may be formed using a metal, a metal alloy, or the like. For example, heat dissipation ring 20 may comprise metals and/or metal alloys selected from the group consisting of Al, Cu, Ni, Co, and the like. Heat dissipation ring 20 may also be formed of a composite material selected from the group consisting of silicon carbide, aluminum nitride, graphite, and the like. Heat dissipation ring 20 includes a first bottom surface(s) 20A contacting TIM portion 16B, and a second bottom surface(s) 20B adhered to package component 14 through adhesive 22. Adhesive 22 may have a better adhering ability and a lower thermal conductivity than TIM 16. For example, adhesive 22 may have a thermal conductivity lower than about 0.5 W/m*K.

Figure 4:
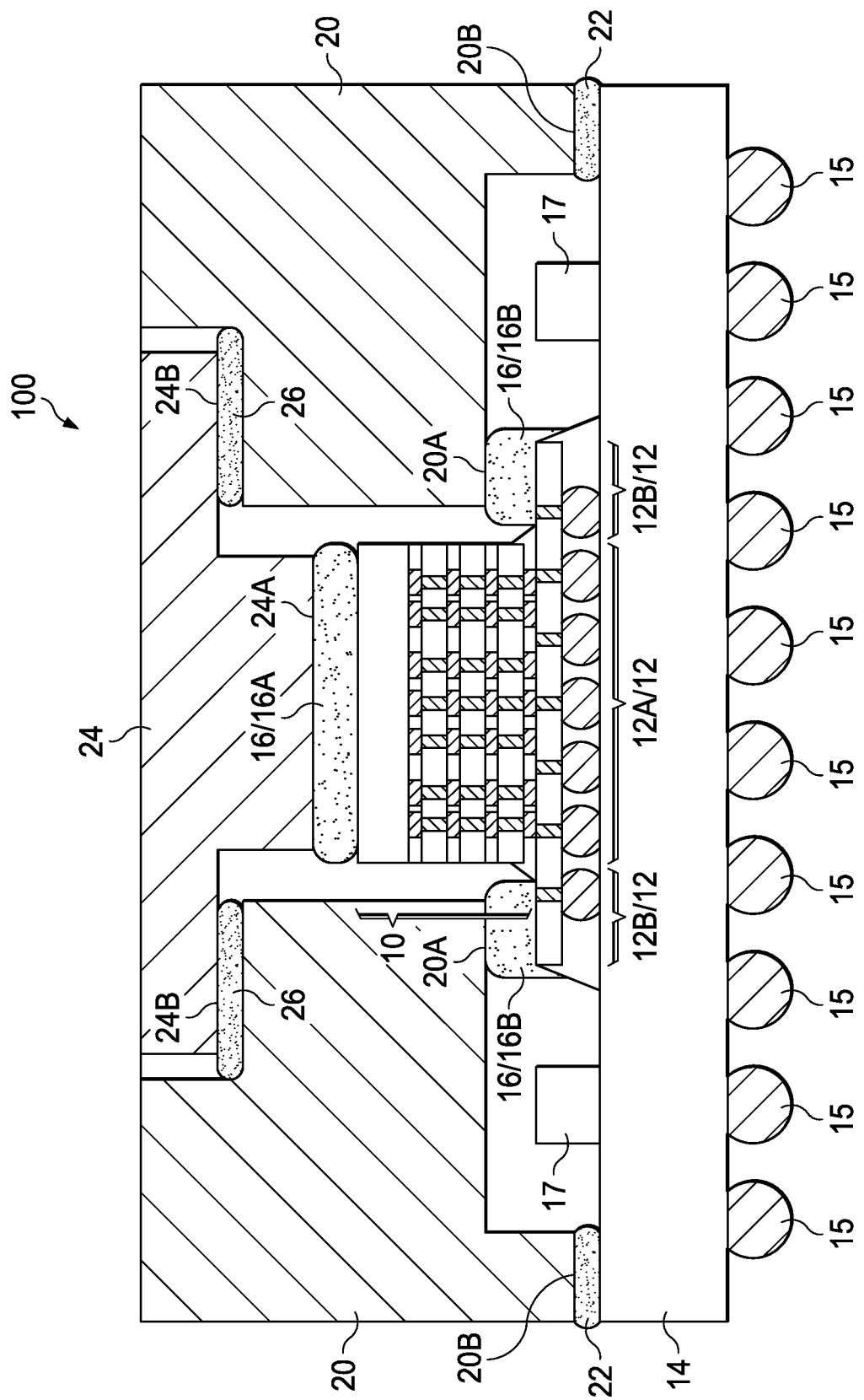

Next, referring to FIG. 4, adhesive 26 is dispensed on a top surface of heat dissipating ring 20, and heat dissipating lid 24 is mounted. Heat dissipating lid 24 includes bottom surface 24A and bottom surface 24B. The position of bottom surfaces 24A and 24B are designed to fit the height of the top surface of dies 10 (and TIM portion 16A) and the location of adhesive 26. In the illustrated exemplary embodiments, bottom surface 24A is lower than bottom surface 24B. Bottom surface 24A is in contact with TIM portion 16A. Bottom surface is in contact with adhesive 26, which adheres heat dissipating lid 24 to heat dissipating ring 20. The top surfaces of dissipating ring 20 and heat dissipating lid 24 may be substantially co-planar. Heat dissipation lid 24 has a high thermal conductivity greater than about 100 W/m*K, for example, and may be formed using a metal, a metal alloy, or the like. For example, heat dissipation lid 24 may comprise metals and/or metal alloys selected from the group consisting of Al, Cu, Ni, Co, and the like. Heat dissipation lid 24 may also be formed of a composite material selected from the group consisting of silicon carbide, aluminum nitride, graphite, and the like.

Figure 5:
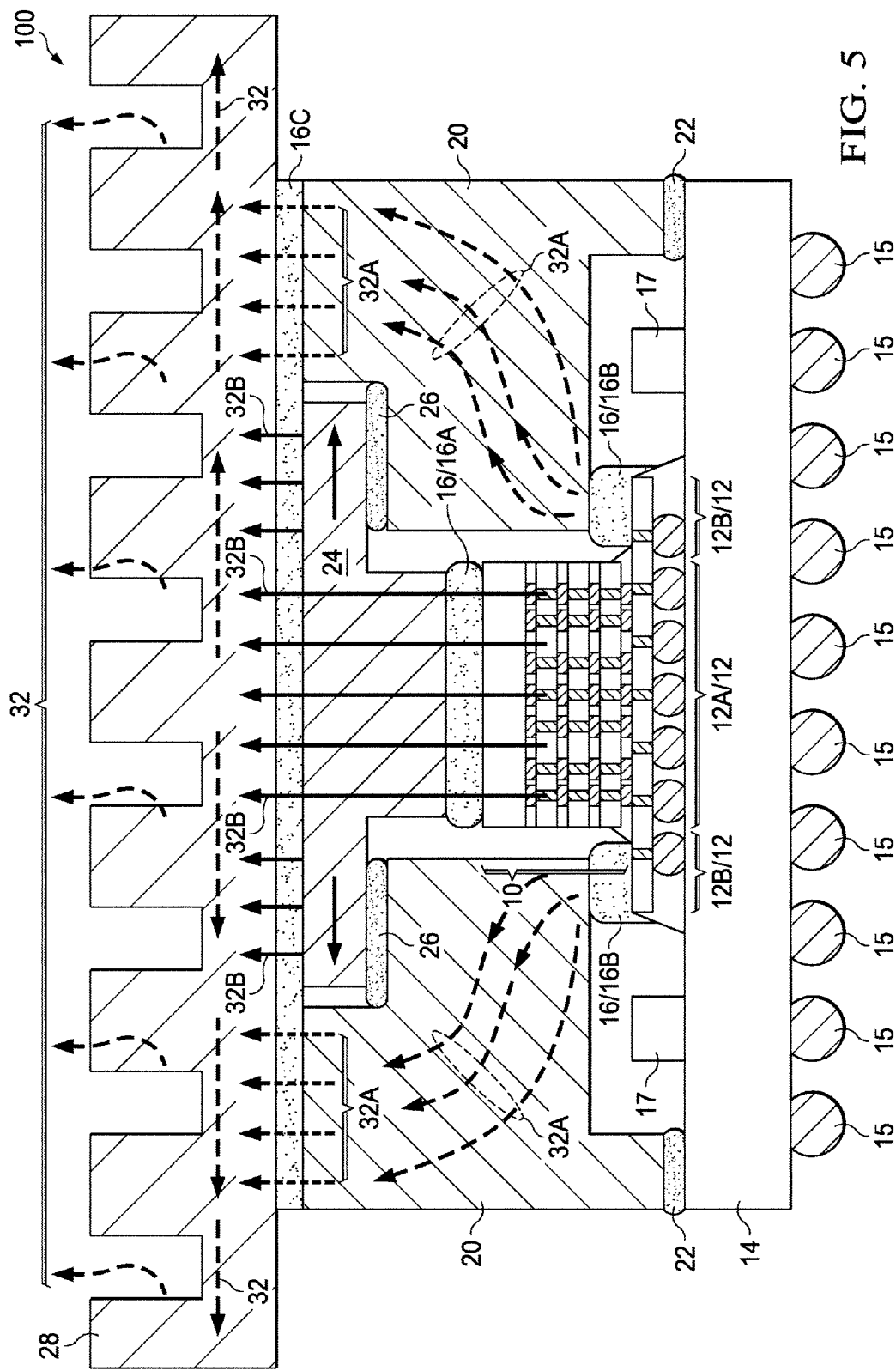

FIG. 5 illustrates the mounting of heat sink 28 on heat dissipating ring 20 and heat dissipating lid 24, wherein TIM 16C is dispensed over heat sink 28 and underlying dissipating ring 20 and heat dissipating lid 24. FIG. 5 illustrates the heat dissipating paths 32 (including 32A and 32B) represented by arrows. From die stacks 10/12, there are two major heat dissipating paths 32A and 32B. The heat generated in die 12 may be dissipated to heat dissipating ring 20 through heat dissipating paths 32A, and further dissipated to heat sink 28 through TIM portion 16C. The heat generated in dies 10 may be dissipated to heat dissipating lid 24 through heat dissipating paths 32B, and further dissipated to heat sink 28 through TIM portion 16C. Since Adhesive 26 has a low thermal conductivity, the cross-dissipation of the heat in heat dissipating ring 20 and heat dissipating lid 24 is not significant, and may be ignored.

In the embodiments in FIG. 5, the heat in die 12 has its own heat dissipation path, which does not go through the overlying dies 10, as often seen in conventional heat dissipating structures. Since die 12 may be a logic die that consumes higher power, the heat generated by die 12, if dissipated through dies 10 (which may be memory dies), will adversely affect the performance and reliability of dies 10. In the embodiments of the present disclosure, the heat generated by die 12 does not go through dies 10, and dies 10 are not affected.

Figure 6A:
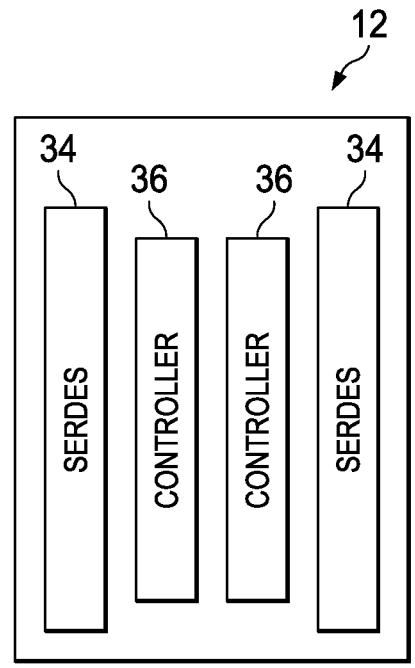
FIGS. 6A and 6B illustrate the floor planes of a logic die and a memory die in accordance with some embodiments.
Figure 6B:
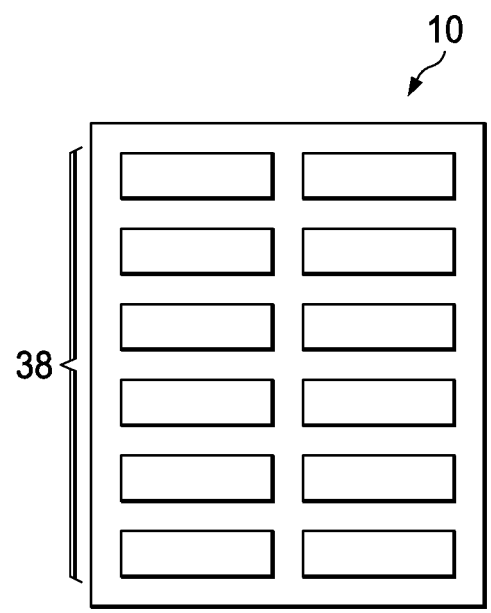

FIGS. 6A and 6B illustrate some exemplary floor planes of dies 12 and 10, respectively, which floor planes affect the customization of heat dissipating lid 24 and heat dissipating 20. For example, in FIG. 6A, die 12 includes high-power-consuming circuits 34 and low-power-consuming circuits 36 consuming less power than high-power-consuming circuits 34. The high-power-consuming circuits 34 may be Serializer/Deserializer (Serdes), and the low-power-consuming circuits may be controllers in some embodiments. Serdes 34 consumes more power, and hence generates more heat, than controllers 36. In accordance with some embodiments, Serdes 34 (or other high-power circuits) are at least partially, and possibly in entirety, allocated in portions 12B of die 12, which portions 12B are not overlapped by dies 10, as shown in FIG. 5. On the other hand, controllers 36 (or other low-power circuits) are at least partially, and possibly entirely, allocated in portion 12A of die 12, which portion 12A is overlapped by dies 10, as shown in FIG. 5. FIG. 6B schematically illustrates an exemplary floor plane of die 10, which is a memory die in these embodiments. Memory die 10 may include a plurality of memory storage banks 38 distributed throughout die 10.

As shown in FIG. 5, by overlapping heat dissipating ring 20 with die portions 12B that have high-power-consuming circuits, the heat generated in the high-power-consuming circuits may be dissipated to heat dissipating ring 20 directly without going through dies 10. The heat dissipating efficiency is thus improved.

FIGS. 7, 8, and 9 illustrate some examples wherein the high-power-consuming circuits 34 are distributed to different parts of die 12, and the respective schemes for designing heat dissipating ring 20. Each of FIGS. 7, 8, and 9 illustrates a top view of dies 10, die 12, and a portion of heat dissipating ring 20. Although heat dissipating ring 20 may form a ring, for clarity, only the portion of heat dissipating ring 20 close to high-power-consuming circuits 34 are illustrated, while other parts are not shown. Referring to FIG. 7, high-power-consuming circuit 34 is distributed at the left bottom corner of the illustrated die 12, wherein portion 34A of high-power-consuming circuit 34 is overlapped by dies 12 (through TIM 16B, refer to FIG. 5), and portion 34B of high-power-consuming circuit 34 is not overlapped by dies 10. Heat dissipating ring 20 includes an arm extend to overlap portion 34B of high-power-consuming circuit 34. It is to be appreciated that although FIGS. 7, 8, and 9 illustrate that heat dissipation ring 20 extends to overlap high-power-consuming circuits 34 of die 12, heat dissipation ring 20 may also extend to overlap low-power-consuming circuits 36 (FIG. 5) of die 12, and the overlapped portions of heat dissipation ring 20 and die 12 forms a ring.

FIG. 8 illustrates the top view of a package in accordance with alternative embodiments. In these embodiments, two high-power-consuming circuits 34 are allocated to close to two edges of die 12. Accordingly, heat dissipating ring 20 includes two arms, each extending to overlap one of high-power-consuming circuits 34. In FIG. 9, one high-power-consuming circuit 34 is close to the left edge of die 12, and the other high-power-consuming circuit 34 is close to the right bottom corner of die 12. Accordingly, heat dissipating ring 20 includes an extension bar overlapping the high-power-consuming circuit 34 at the left edge, and an extension arm overlapping the right bottom corner of die 12.

Figure 10:
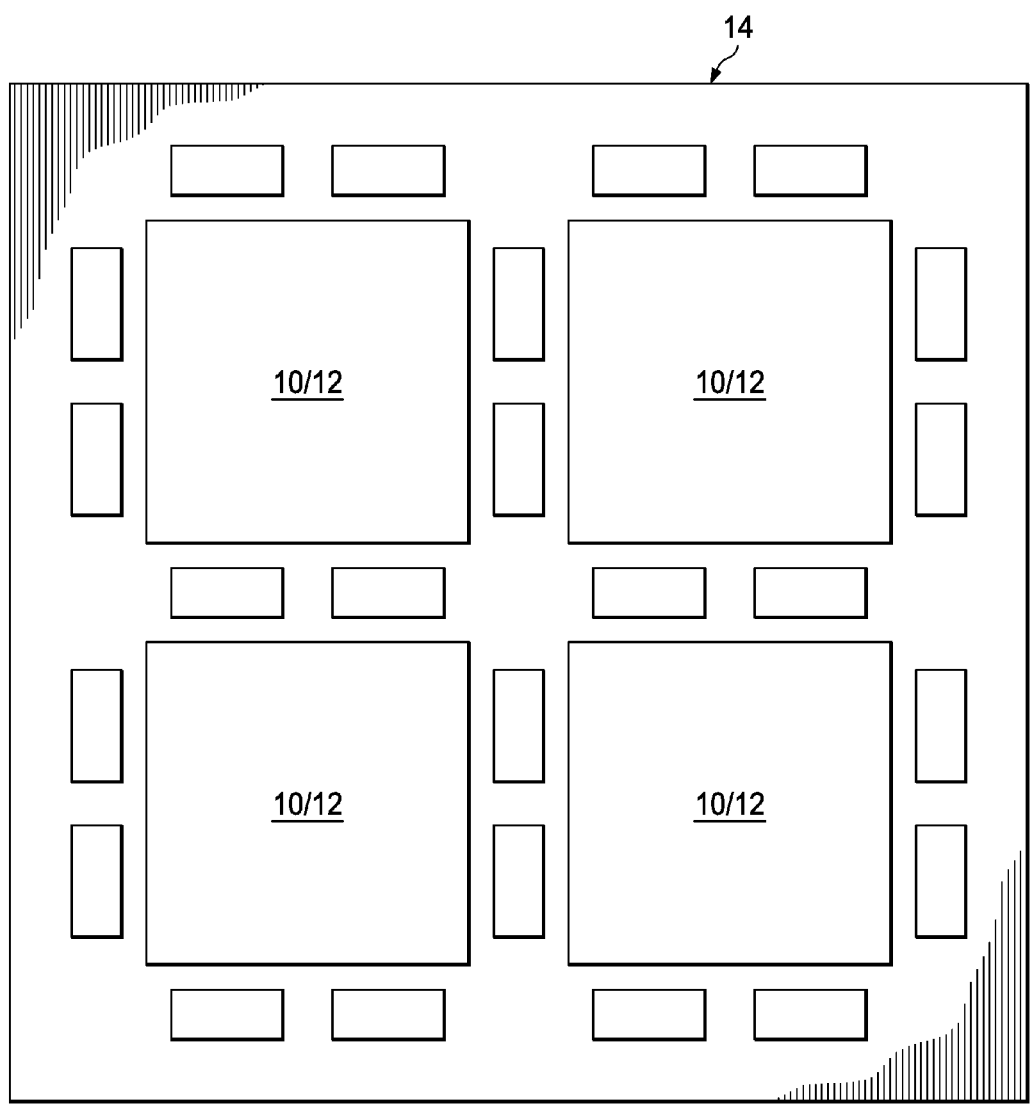
FIG. 10 illustrates a top view of a plurality of die stacks bonded to a package component.
Figure 11A:
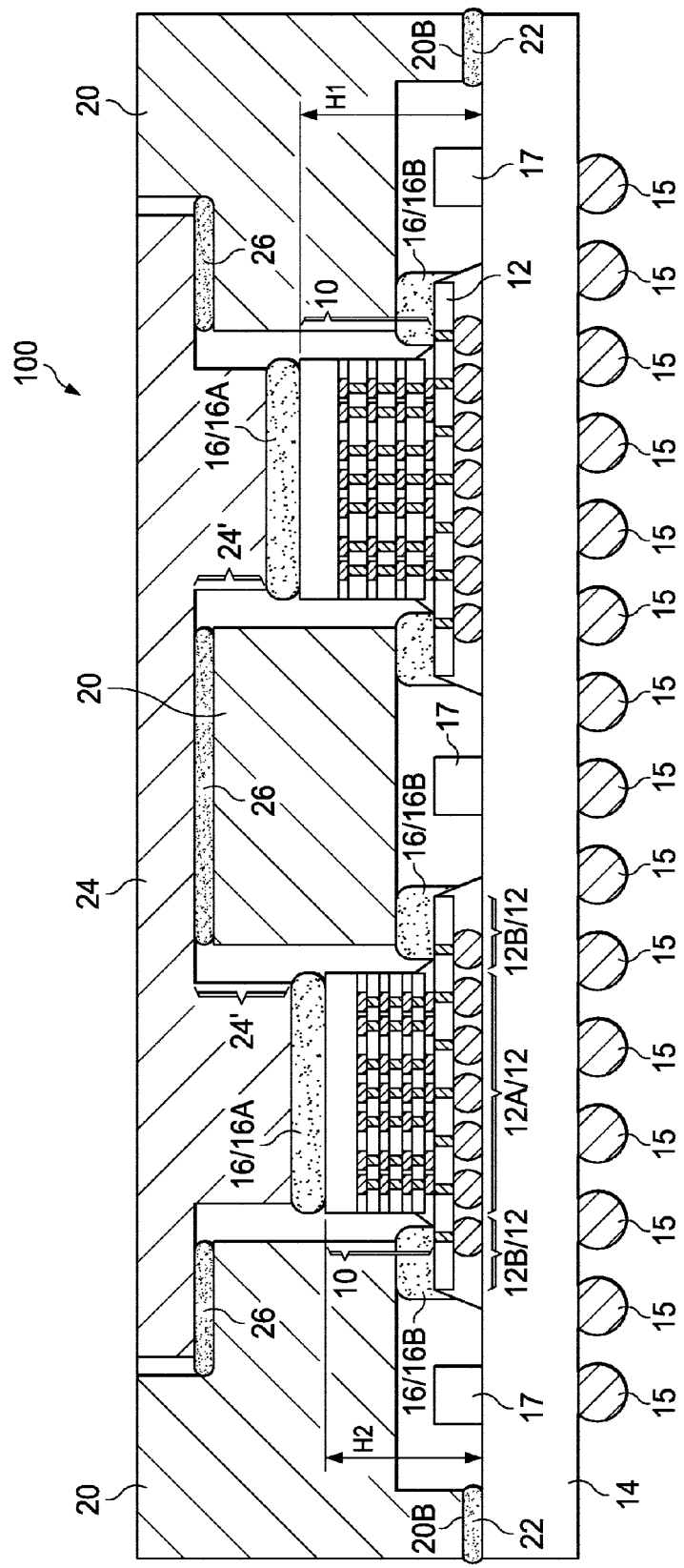

FIGS. 10 through 11C illustrate the heat dissipation scheme in accordance with alternative embodiments. FIG. 10 illustrates a plurality of die stacks 10/12 bonded to package component 14. In the illustrated examples, there are four die stacks 10/12. FIG. 11A illustrates a cross-sectional view of the respective package. As shown in FIG. 11A, die stacks 10/12 may have heights H1 and H2, which may be equal to each other or different from each other. Accordingly, heat dissipating lid 24 comprises a plurality of portions 24' extending down to different levels to compensate for the height difference of die stacks 10/12. The plurality of portions 24' are in contact with TIM portions 16A.

Figure 11B:
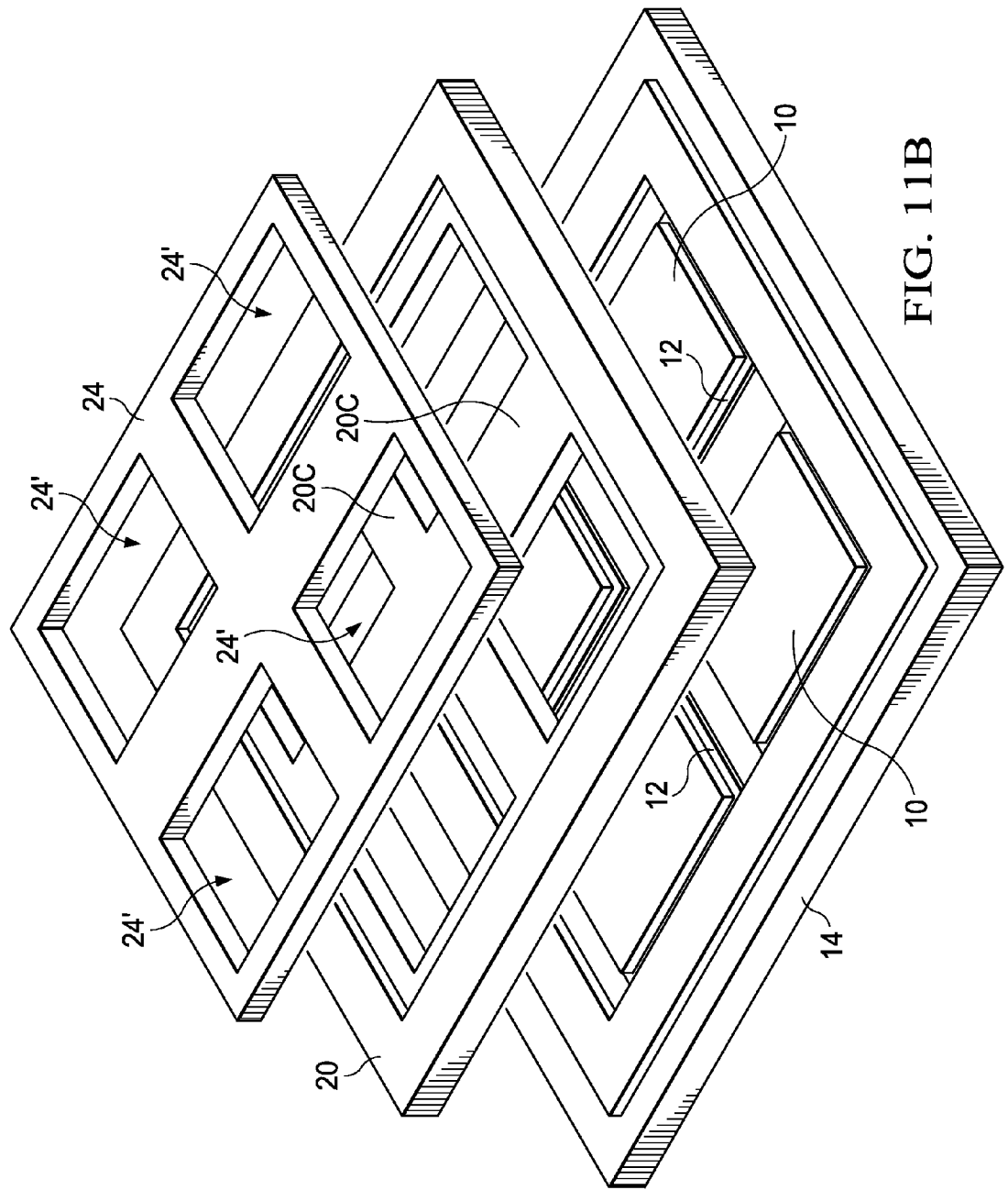

FIGS. 11B and 11C illustrate the perspective view and a cross-section of the perspective view, respectively, of the package before assembled. As shown in FIG. 11B, heat dissipating ring 20 may comprise a plurality of extensions 20C extending into the spaces between die stacks 10/12 (FIG. 10). In the illustrated example, the extensions 20C form a cross, wherein the cross is inside a part of heat dissipating ring 20 that forms a rectangular frame. The ends of cross 20C are connected to the rectangular frame so that heat dissipating ring 20 forms an integrated unit. Accordingly, in the top view of heat dissipating ring 20, heat dissipating ring 20 includes four openings. Heat dissipating lid 24 includes thin portions that are to be supported by heat dissipating ring 20. Heat dissipating lid 24 also includes portions 24' that extend into the openings in heat dissipating ring 20.

Figure 12:
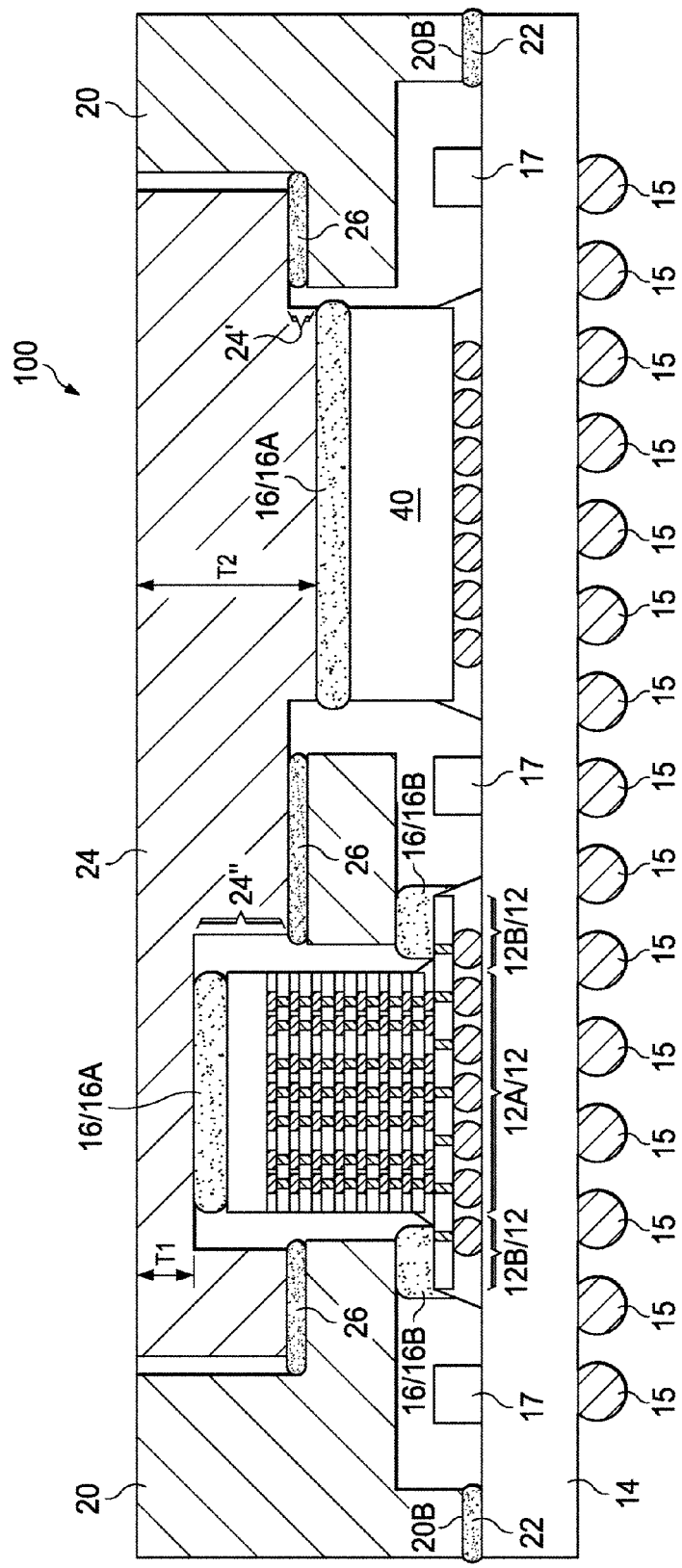
FIG. 12 illustrates the cross-sectional view of a package in accordance with some embodiments, wherein the heat dissipating lid comprises a recessed portion and a protruding portion.

FIG. 12 illustrates the heat dissipation scheme in accordance with yet alternative embodiments. Package 100 in these embodiments is similar to the embodiments in FIG. 11A, except package 100 in these embodiments include a high die stack 10/12, and a System-on-Chip (SoC) die 40 with a smaller height. There is a significant height difference between die stacks 10/12 and die 40. To accommodate for the height difference, heat dissipating lid 24 includes recess 24", wherein the recessed portion has thickness T1. Die stack 10/12 extends into recess 24". Heat dissipating lid 24 also includes protruding portion 24', wherein the protruding portion has thickness T2. As shown in FIG. 12, the recessed portion and the protruded portion of heat dissipating lid 24 have different thicknesses T1 and T2, respectively, which are selected to compensate for the height difference between die stacks 10/12 and SoC die 40. In these embodiments, the heat in dies 10 and SoC die 40 are dissipated to the same heat dissipating lid 24.

Figure 13:
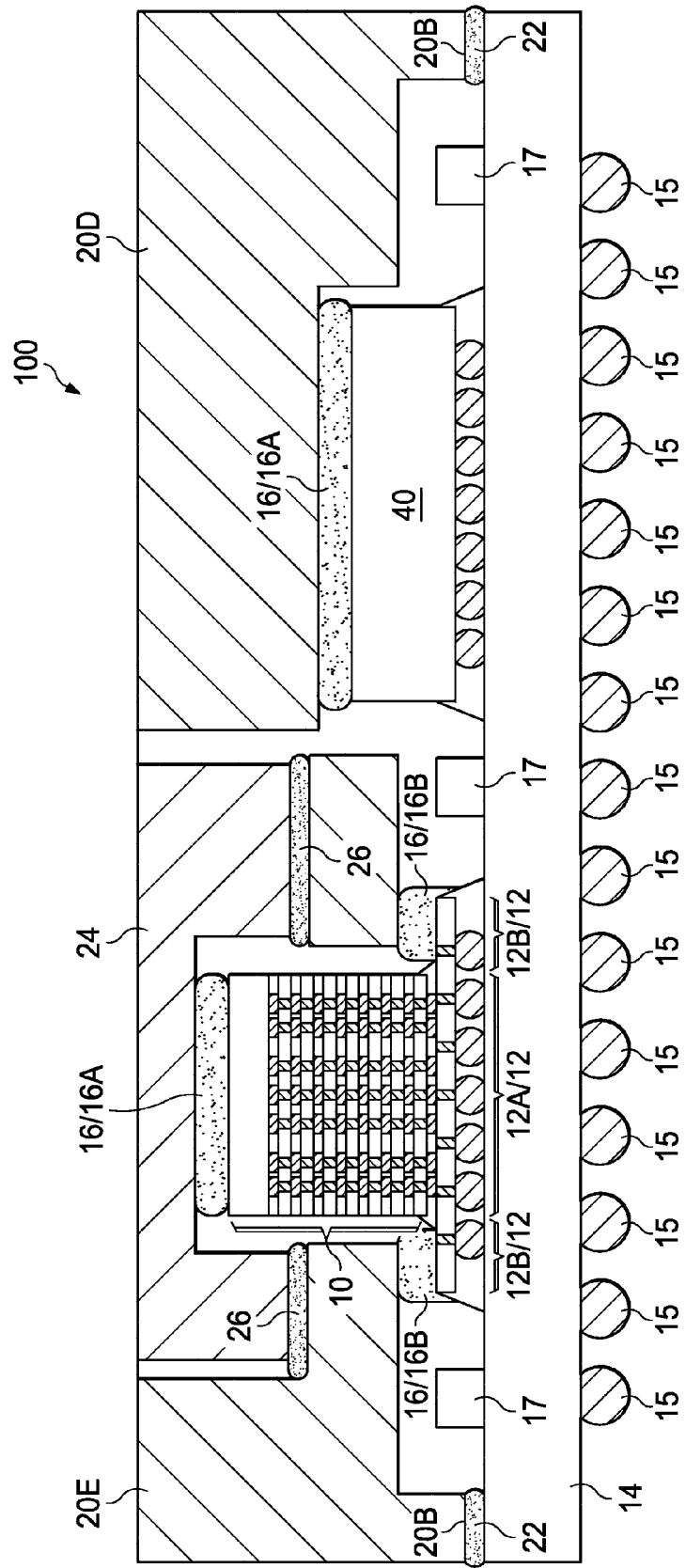
FIG. 13 illustrates the cross-sectional view of a package in accordance with some embodiments, wherein a System-on-Chip die is bonded.

FIG. 13 illustrates the heat dissipation scheme in accordance with yet alternative embodiments. These embodiments differ from the embodiments in FIG. 12 in that the SoC die 40 in these embodiments consumes more power than in the embodiments in FIG. 12. Accordingly, the top of SoC die 40 is adhered to heat dissipating ring 20D (through TIM 16) instead of heat dissipating lid 24, so that the heat in dies 10 and die 40 are dissipated through different heat-dissipating components. Portion 12B of die 12 is adhered to heat dissipating ring 20E (through TIM 16). Accordingly, in these embodiments, the heat in dies 10 is dissipated to heat dissipating lid 24, while the heat in SoC die 40 is dissipated to dissipating ring 20D. In some embodiments, heat dissipating rings 20D and 20E are separate heat dissipating components physically disconnected from each other. In alternative embodiments, heat dissipating rings 20D and 20E, although appear to be disconnected in the cross-sectional view, are parts of the same integrated heat dissipating ring. The areas of heat dissipating ring 20D may be increased to improve the heat dissipating ability.

Figure 14:
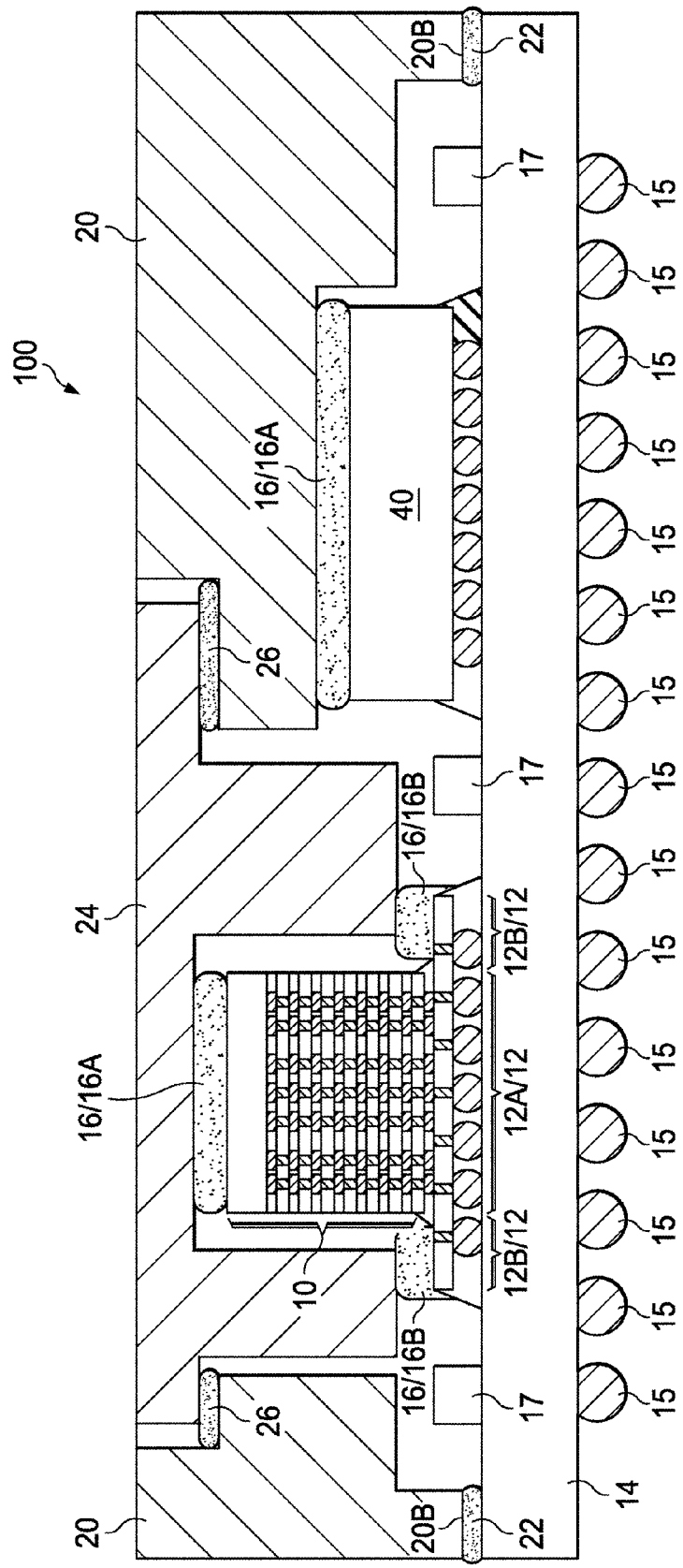
FIG. 14 illustrates the cross-sectional view of a package in accordance with some embodiments, wherein a System-on-Chip die is bonded, and wherein a heat dissipating lid overlaps to contact different dies of a die stack.

FIG. 14 illustrates the heat dissipation scheme in accordance with yet alternative embodiments. These embodiments differ from the embodiments in FIG. 13 in that heat dissipating lid 24 includes a recessed portion for die stacks 10/12 to extend in, and protruding portions to adhere to portions 12B of die 12. Accordingly, the heat generated in die portions 12B and dies 10 are dissipated to the same heat dissipating lid 24. On the other hand, heat dissipating ring 20 comprises a bottom surface adhered to SoC die 40 through TIM 16, so that the heat generated in SoC die 40 is dissipated to heat dissipating ring 20.

Figure 15A:
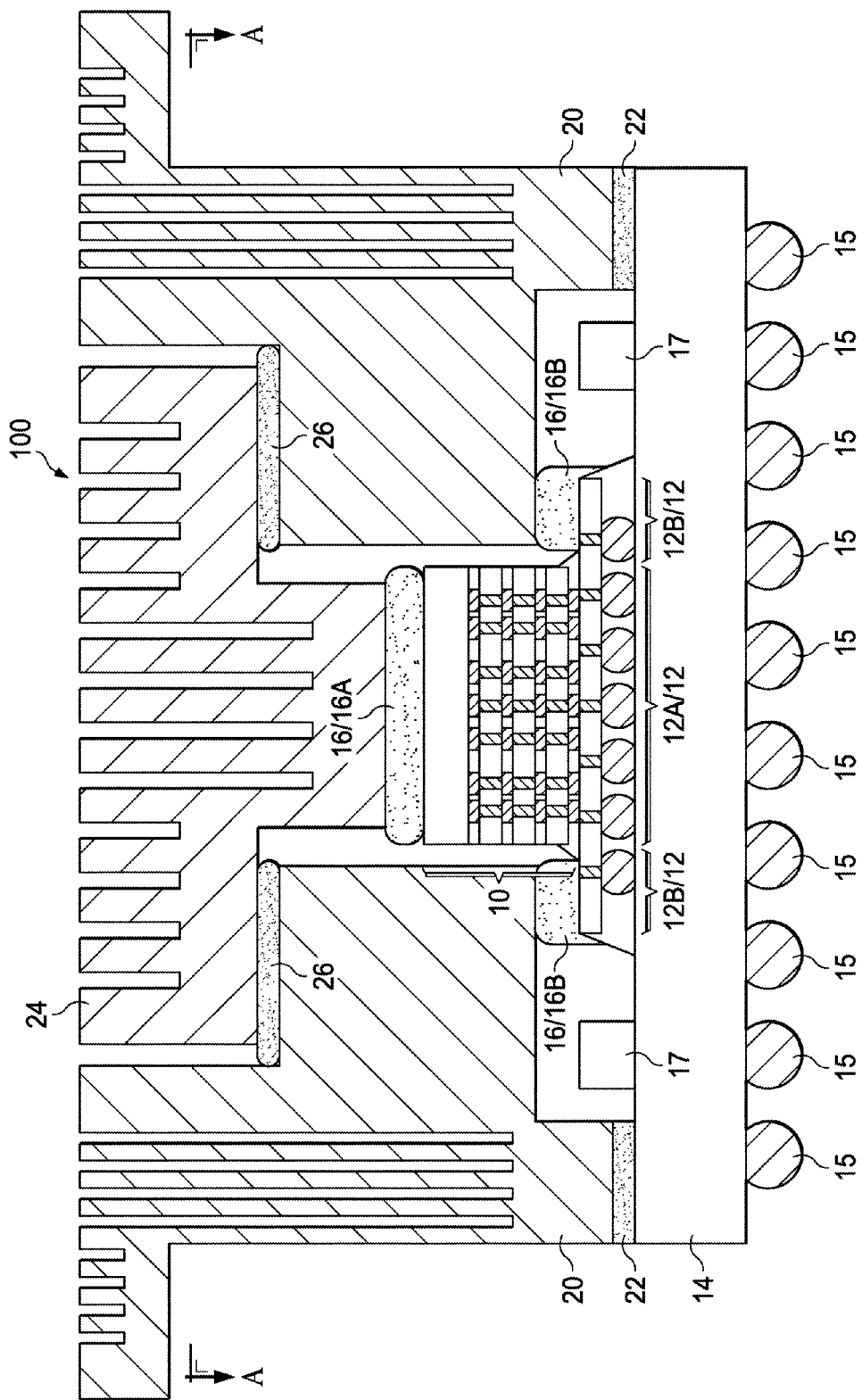
FIGS. 15A and 15B illustrate a cross-sectional view and a top view of a package in accordance with some embodiments, wherein a heat dissipating lid and a heat dissipating ring comprise heat sinks.
Figure 15B:
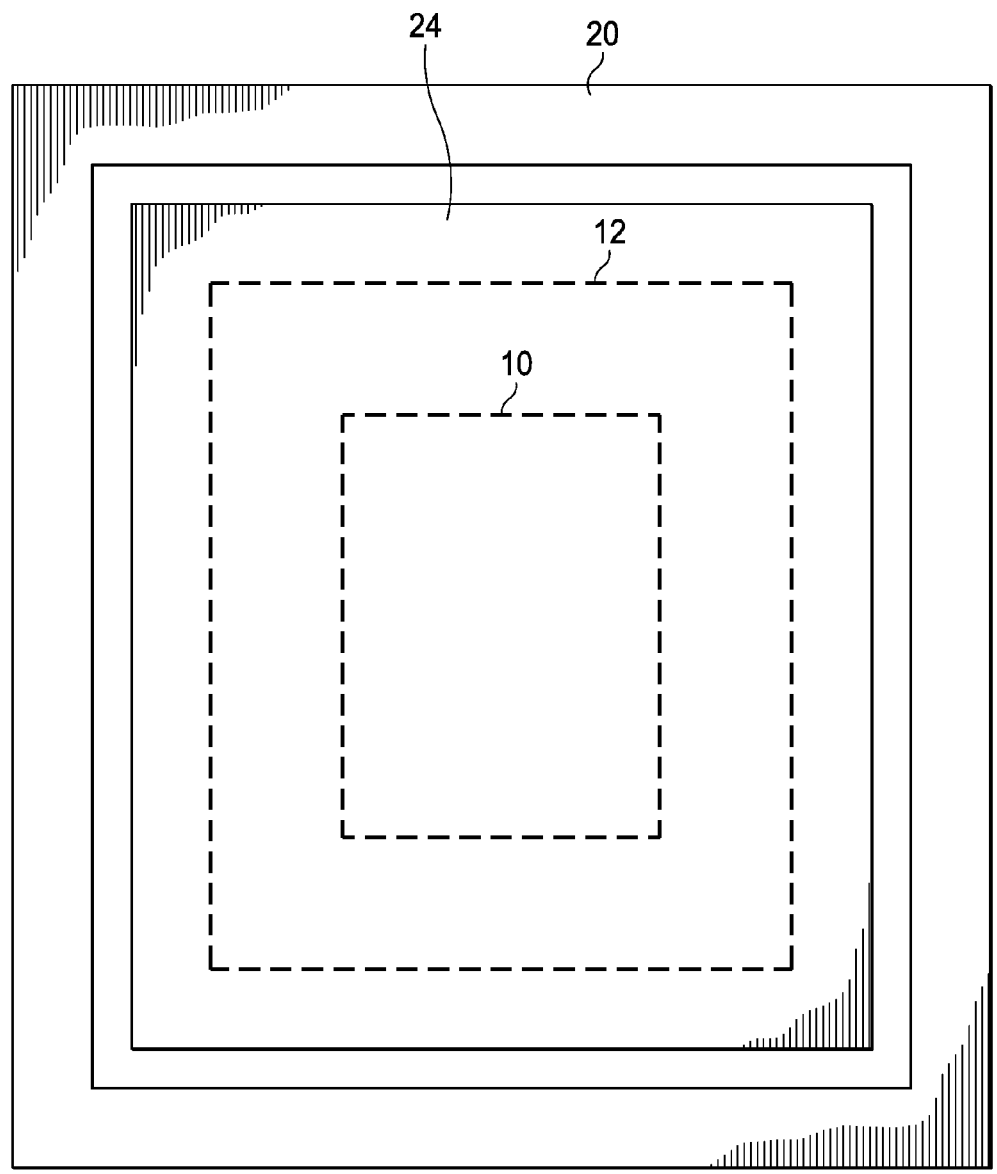

FIGS. 15A and 15B illustrate the heat dissipation scheme in accordance with yet alternative embodiments. These embodiments are similar to the embodiments in FIG. 5, except that heat dissipating ring 20 and/or heat dissipating lid 24 are heat sinks comprising fins and recesses separating the fins. With the fins, the heat dissipating ability of heat dissipating ring 20 and/or heat dissipating lid 24 is improved due to increased surface. FIG. 15A illustrates a cross-sectional view. In some embodiments, heat dissipating ring 20 includes portions extending beyond the edges of package component 14 to increase the heat dissipating ability. FIG. 15B illustrates a top view, wherein the top view is obtained at the level A-A in FIG. 15A. FIG. 15B illustrates that heat dissipating ring 20 encircles heat dissipating lid 24 and dies 10.

By using both heat dissipating ring 20 and heat dissipating lid 24, the heat in packages may be dissipated more efficiently. A simulation is performed to simulate the temperature distribution in the in packages comprising stacked dies. The simulation results indicated that by overlapping high-power-consuming circuits using the heat dissipating ring, the operation temperature of the high-power-circuits portion of a sample logic die is reduced from 90.5° C. in conventional packages to 72.3° C. in accordance with embodiments. Furthermore, the operation temperature of the low-power-circuits portion of the sample logic die is reduced from 77.9° C. in conventional packages to 72.1° C. in accordance with embodiments. Therefore, by adopting the heat dissipating schemes of the embodiments of the present disclosure, not only the operation temperatures of the packages are reduced, the hot spots are also eliminated.

In accordance with some embodiments, a package includes a first die and a second die underlying the first die and in a same first die stack as the first die. The second die includes a first portion overlapped by the first die, and a second portion not overlapped by the first die. A first TIM is over and contacting a top surface of the first die. A heat dissipating lid has a first bottom surface contacting the first TIM. A second TIM is over and contacting the second portion of the second die. A heat dissipating ring is over and contacting the second TIM.

In accordance with other embodiments, a package includes a die stack including a plurality of dies, and a die underlying and bonded to the die stack. The die includes a first portion overlapped by the die stack, and a second portion not overlapped by the die stack. A first TIM is over and contacting a top surface of the die stack. A heat dissipating lid has a first portion over and contacting the first TIM, and a second portion overlapping the second portion of the die. A second TIM is over and contacting the second portion of the die. A heat dissipating ring has an extension portion, wherein the extension portion is overlapped by the second portion of the heat dissipating lid. The extension portion of the heat dissipating ring further includes a bottom surface contacting the second TIM.

In accordance with yet other embodiments, a package includes a die stack including a plurality of dies, and a die underlying and bonded to the die stack. The die includes a first portion overlapped by the die stack, and a second portion not overlapped by the die stack. A first TIM is over and contacting a top surface of the die stack. A second TIM is over and contacting the second portion of the die. A heat dissipating lid has a first bottom surface contacting the first TIM, and a second bottom surface contacting the second TIM.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A package comprising:
 a die stack comprising a plurality of dies;
 a die underlying and bonded to the die stack, wherein the die comprises:

a first portion overlapped by the die stack; and
a second portion not overlapped by the die stack;
a first Thermal Interface Material (TIM) over and contacting a top surface of the die stack;
a second TIM over and contacting the second portion of the die;
a heat dissipating lid comprising:
a first bottom surface contacting the first TIM; and
a second bottom surface contacting the second TIM;
a package substrate, wherein the die is over and bonded to the package substrate; and
a heat dissipating ring over and adhered to the package substrate.

2. The package of claim 1 further comprising a second adhesive comprising:
a bottom surface contacting the heat dissipating ring; and
a top surface contacting the heat dissipating lid.

3. The package of claim 1, wherein top surfaces of the heat dissipating ring and the heat dissipating lid are substantially co-planar.

4. The package of claim 1 further comprising a discrete passive device overlapped by the heat dissipating lid.

5. A package comprising:
a die stack comprising a plurality of dies;
a die underlying and bonded to the die stack, wherein the die comprises:
a first portion overlapped by the die stack; and
a second portion not overlapped by the die stack;
a first Thermal Interface Material (TIM) over and contacting a top surface of the die stack;
a second TIM over and contacting the second portion of the die; and
a heat dissipating lid comprising a recess extending from a bottom surface of the heat dissipating lid into the heat dissipating lid, wherein the die stack and the first TIM extend into the recess, and the bottom surface of the heat dissipating lid is in contact with a top surface of the second TIM, and wherein top surfaces of the heat dissipating ring and the heat dissipating lid are substantially co-planar.

6. The package of claim 5 further comprising a heat dissipating ring encircling the heat dissipating lid.

7. The package of claim 6 further comprising:
a package substrate, wherein the die is over and bonded to the package substrate;
a System-on-Chip (SoC) die over and bonded to the package substrate;
a third TIM over and contacting the SoC die; and
a first adhesive adhering the heat dissipating ring to the package substrate.

8. The package of claim 7 further comprising a second adhesive comprising:
a top surface in contact with an additional bottom surface of the heat dissipating lid; and
a bottom surface in contact with a top surface of the heat dissipating ring.

9. The package of claim 7, wherein the heat dissipating ring encircles the SoC die.

10. The package of claim 7 further comprising a discrete passive device bonded to the package substrate, wherein the discrete passive device is overlapped by the heat dissipating lid.

11. A package comprising:
a die stack comprising a plurality of dies;
a heat dissipating lid comprising a portion encircling the die stack;
a first Thermal Interface Material (TIM) between and contacting a top surface of the die stack and a first bottom surface of the heat dissipating lid; and
a heat dissipating ring encircling the heat dissipating lid.

12. The package of claim 11, wherein a portion of heat dissipating ring extends underlying a portion of the heat dissipating lid, and the package further comprises an adhesive comprising:
a top surface in contact with a bottom surface of the portion of the heat dissipating lid; and
a bottom surface in contact with a top surface of the portion of the heat dissipating ring.

13. The package of claim 11 further comprising:
a die underlying and bonded to the die stack; and
a second TIM comprising:
a top surface in contact with a second bottom surface of the heat dissipating lid; and
a bottom surface in contact with a top surface of the die.

14. The package of claim 13 further comprising:
a package substrate, wherein the die is over and bonded to the package substrate.

15. The package of claim 14 further comprising:
a System-on-Chip (SoC) die over and bonded to the package substrate; and
a third TIM over the SoC die and connect the SoC die to the heat dissipating ring.

16. The package of claim 1, wherein the die comprises a high-power-consuming circuit and a low-power-consuming circuit consuming less power than the high-power-consuming circuit, and the high-power-consuming circuit is at least partially located in the second portion of the die.

17. The package of claim 16, wherein the low-power-consuming circuit is overlapped by the die stack.

18. The package of claim 5, wherein the die comprises a high-power-consuming circuit and a low-power-consuming circuit consuming less power than the high-power-consuming circuit, and the high-power-consuming circuit is at least partially located in the second portion of the die.

19. The package of claim 18, wherein the low-power-consuming circuit is overlapped by the die stack.

20. The package of claim 13, wherein the die comprises a high-power-consuming circuit and a low-power-consuming circuit consuming less power than the high-power-consuming circuit, and the high-power-consuming circuit is at least partially located in the a portion of the die un-overlapped by the die stack.

* * * * *